US 12,055,149 B2

(12) United States Patent
He

(10) Patent No.: US 12,055,149 B2
(45) Date of Patent: Aug. 6, 2024

(54) BLOWER FAN WITH THROUGH HOLE AND FAN SUPPORT ROD

(71) Applicant: Dell Products, LP, Round Rock, TX (US)

(72) Inventor: Qinghong He, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 727 days.

(21) Appl. No.: 16/931,114

(22) Filed: Jul. 16, 2020

(65) Prior Publication Data

US 2022/0018351 A1 Jan. 20, 2022

(51) Int. Cl.
| F04D 25/06 | (2006.01) |
| F04D 29/059 | (2006.01) |
| F04D 29/22 | (2006.01) |
| F04D 29/42 | (2006.01) |
| G06F 1/20 | (2006.01) |
| H05K 7/20 | (2006.01) |

(52) U.S. Cl.
CPC ........... *F04D 25/06* (2013.01); *F04D 29/059* (2013.01); *F04D 29/22* (2013.01); *F04D 29/4226* (2013.01); *G06F 1/20* (2013.01); *H05K 7/20172* (2013.01)

(58) Field of Classification Search
CPC ........ F04D 25/06; F04D 29/059; F04D 29/22; F04D 29/4226; G06F 1/20; H05K 7/20172; Y02B 30/70
See application file for complete search history.

(56) References Cited

U.S. PATENT DOCUMENTS

| 2,330,938 A | 10/1943 | Edmond |
| 3,592,260 A | 7/1971 | Berger |
| 3,950,112 A | 4/1976 | Crump |
| 6,021,042 A | 2/2000 | Anderson |
| 6,328,097 B1 | 12/2001 | Bookhardt |
| 6,373,700 B1 | 4/2002 | Wang |
| 6,525,936 B2 | 2/2003 | Beitelmal |
| 6,567,269 B2 | 5/2003 | Homer |
| 6,652,223 B1 | 11/2003 | Horng |

(Continued)

FOREIGN PATENT DOCUMENTS

CN 108425866 B 8/2020

*Primary Examiner* — Charles G Freay
*Assistant Examiner* — Lilya Pekarskaya
(74) *Attorney, Agent, or Firm* — Prol Intellectual Property Law, PLLC; H. Kenneth Prol

(57) ABSTRACT

An information handling system includes: a processor, a memory, and a power source; and a blower fan system including: a cylindrical bearing including a cylindrical hollow receiving portion extending from a top of the cylindrical bearing to the bottom of the cylindrical bearing; a cylindrical main shaft rotatably coupled in the cylindrical hollow receiving portion of the cylindrical bearing including a shaft pass-through hollow portion extending from a top of the cylindrical main shaft to the bottom of the cylindrical main shaft to form a pass-through hole; a set of fan blades mechanically coupled to the cylindrical main shaft having a set of magnets; an electromagnet to drive rotation of the set of fan blades; and a fan support rod passing through the cylindrical bearing and cylindrical main shaft at the shaft pass-through hollow portion and mechanically supporting the fan within a base chassis.

20 Claims, 8 Drawing Sheets

(56) References Cited

U.S. PATENT DOCUMENTS

| | | |
|---|---|---|
| 6,789,999 B2 | 9/2004 | Bikos |
| 6,989,988 B2 | 1/2006 | Arbogast |
| 7,071,587 B2 | 7/2006 | Lopatinsky |
| 7,079,388 B2 | 7/2006 | Faneuf |
| 7,079,394 B2 | 7/2006 | Mok |
| 7,215,543 B2 | 5/2007 | Arbogast |
| 8,104,295 B2 | 1/2012 | Lofy |
| 8,142,147 B2 | 3/2012 | O'Connor |
| 9,845,805 B2 * | 12/2017 | Bhutani .................... G06F 1/20 |
| 10,485,135 B2 | 11/2019 | He |
| 10,539,150 B2 | 1/2020 | Ling |
| 10,584,717 B1 | 3/2020 | He |
| 10,687,440 B1 | 6/2020 | He |
| 2002/0172008 A1 | 11/2002 | Michael |
| 2003/0161102 A1 | 8/2003 | Lee |
| 2003/0220721 A1 | 11/2003 | Cohen |
| 2004/0099404 A1 | 5/2004 | Cipolla |
| 2006/0078428 A1 | 4/2006 | Zheng |
| 2006/0193113 A1 | 8/2006 | Cohen |
| 2006/0263210 A1 | 11/2006 | Wang |
| 2007/0160462 A1 | 7/2007 | Tsang |
| 2007/0227699 A1 | 10/2007 | Nishi |
| 2007/0268668 A1 | 11/2007 | Lin |
| 2008/0035315 A1 | 2/2008 | Han |
| 2008/0229758 A1 | 9/2008 | Lin |
| 2009/0266518 A1 | 10/2009 | Huang |
| 2009/0324403 A1 | 12/2009 | Zheng |
| 2010/0071875 A1 | 3/2010 | Hwang |
| 2010/0284136 A1 * | 11/2010 | Carr .................... G06F 1/1662 361/679.08 |
| 2011/0097195 A1 | 4/2011 | Horng |
| 2011/0110774 A1 | 5/2011 | Horng |
| 2011/0203295 A1 | 8/2011 | Hsu |
| 2011/0251733 A1 | 10/2011 | Atkinson |
| 2011/0272120 A1 | 11/2011 | Joshi |
| 2012/0087813 A1 * | 4/2012 | Yen .................... F04D 29/4206 174/50 |
| 2013/0004114 A1 * | 1/2013 | Hasegawa ............... F04D 17/16 384/607 |
| 2013/0011255 A1 | 1/2013 | Horng |
| 2013/0243628 A1 | 9/2013 | Zheng |
| 2014/0063726 A1 | 3/2014 | Liu |
| 2014/0092556 A1 | 4/2014 | Turney |
| 2014/0185240 A1 | 7/2014 | Macdonald |
| 2015/0003974 A1 | 1/2015 | Heymann |
| 2015/0093271 A1 * | 4/2015 | Hiromoto .............. H02K 21/00 310/156.43 |
| 2015/0098844 A1 * | 4/2015 | Hsu .................... H05K 7/20172 417/354 |
| 2015/0116928 A1 | 4/2015 | Delano |
| 2015/0198166 A1 * | 7/2015 | Tamaoka ............ F04D 25/0626 361/679.48 |
| 2015/0309539 A1 * | 10/2015 | Kamphuis ................ E05D 5/02 16/337 |
| 2016/0003261 A1 | 1/2016 | Tamaoka |
| 2016/0037683 A1 | 2/2016 | Tamaoka |
| 2016/0093271 A1 * | 3/2016 | Cho ........................ H04N 9/12 345/1.3 |
| 2016/0369811 A1 | 12/2016 | Ling |
| 2017/0359920 A1 | 12/2017 | Huang |
| 2018/0235103 A1 * | 8/2018 | Yeh ....................... F04D 25/064 |
| 2019/0008073 A1 | 1/2019 | He |
| 2019/0184868 A1 | 6/2019 | Kim |
| 2020/0027808 A1 | 1/2020 | Subrahmanyam |
| 2020/0110451 A1 | 4/2020 | He |

\* cited by examiner

BLOWER FAN WITH THROUGH HOLE AND FAN SUPPORT ROD

FIELD OF THE DISCLOSURE

The present disclosure generally relates to an information handling system thermal control system. The present disclosure more specifically relates to a blower fan used within an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a blower fan system used as part of a thermal control system to cool the components within the information handling system such as a processing device or power systems.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
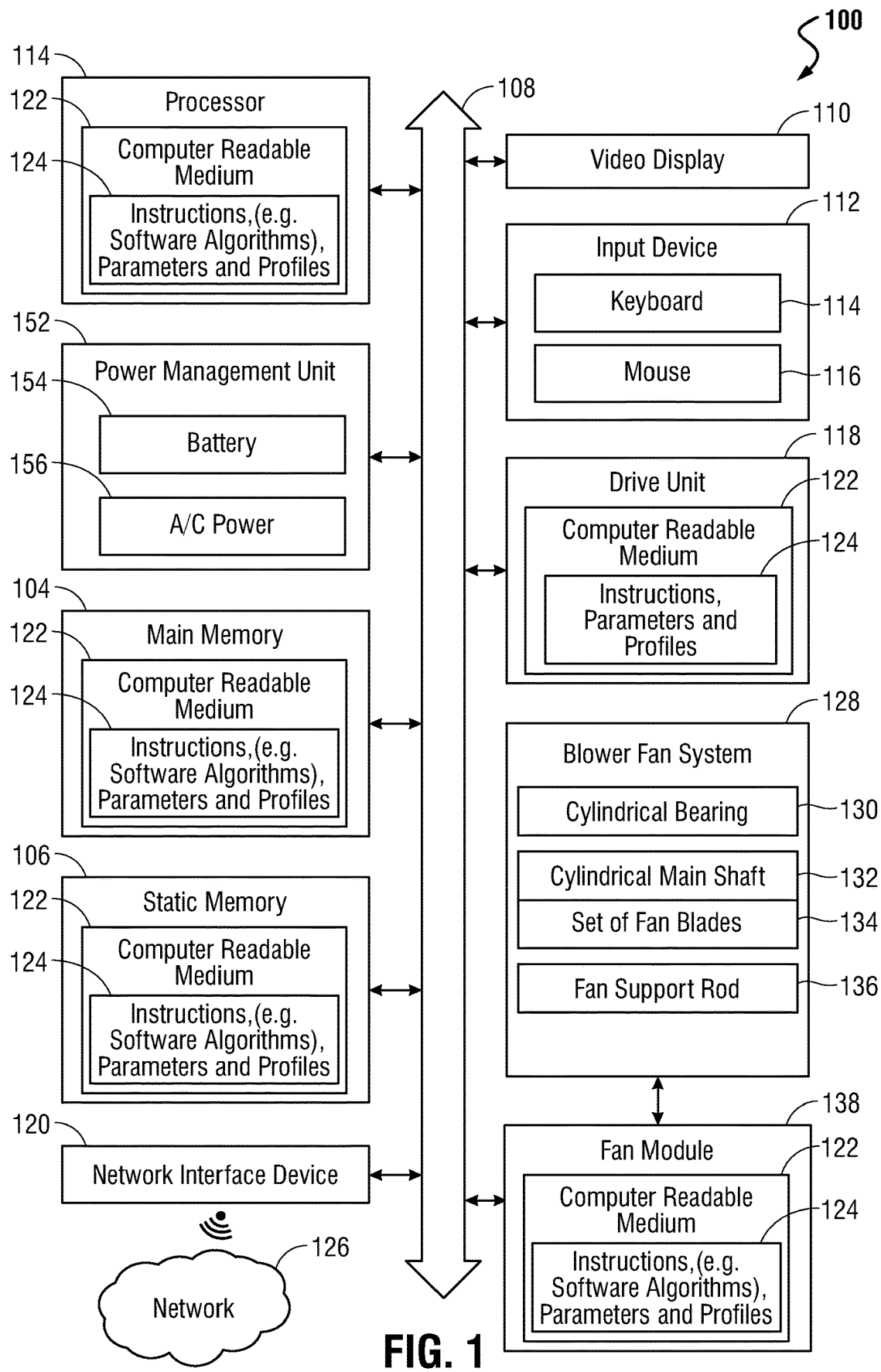
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for an information handling system that includes a blower fan system controlled by a processor or, in some embodiments, a fan module to cool components within the information handling system. The information handling system may include a memory to store computer readable program code for operation of the information handling system and, in a specific embodiment, the blower fan system described herein. The blower fan system of the information handling system may include a cylindrical bearing including a cylindrical hollow receiving portion extending from a top of the cylindrical bearing to the bottom of the cylindrical bearing; a cylindrical main shaft including a cylindrical hollow receiving portion extending from a top of the cylindrical main shaft to the bottom of the cylindrical main shaft; a set of fan blades mechanically coupled to the cylindrical main shaft; and a fan support rod passing through the cylindrical bearing and cylindrical main shaft and mechanically supporting the blower fan system within the information handling system. The fan support rod placed through the cylindrical bearing and cylindrical main shaft may be operatively coupled to any structure or chassis of the information handling system so that the structure, and especially the D-cover, cannot be bent or deformed into the set of fan blades thereby causing damage to the fan blades.

In some embodiments, the blower fan system may further include a printed circuit board and an electromagnet mechanically coupled to the cylindrical bearing wherein the printed circuit board comprises electrical circuitry to receive electrical signals from the processor to drive the actuation of the electromagnet. In an embodiment, the blower fan system may also include a permanent magnet mechanically coupled to the set of fan blades to magnetically couple the set of fan blades to the electromagnet that is mechanically coupled to the cylindrical bearing. Alternatively, or additionally, the blower fan system may include a central bearing that may function as a sleeve bearing with lubricant or have one or more ball bearings or roller bearings that mechanically couples the cylindrical main shaft to the cylindrical bearing in some embodiments. The sleeve bearing may be a precisely fit mating to prevent vertical movement in some embodiments. In other embodiments, the roller bearing or ball bearing may be placed within mating recesses formed within the interior surface of the cylindrical bearing and the exterior surface of the cylindrical main shaft. This may prevent the cylindrical main shaft moving vertically within the cylindrical hollow receiving portion of the cylindrical bearing. In other embodiments, the roller bearing(s) or ball bearing(s) may be disposed in the cylindrical main shaft.

In some embodiments, a keyboard support chassis for supporting keyboard structures in the information handling system may be formed above the blower fan system. The fan support rod may be mechanically coupled to the underside of the keyboard support chassis to secure the position of the fan support rod within the blower fan system. Alternatively, or additionally, the information handling system may include a D-cover formed below the blower fan system with the fan support rod is mechanically coupled to the D-cover to secure the blower fan system with respect to the base chassis of an information handling system.

In order to allow for air travel into the blower fan system and throughout the information handling system, the D-cover may include a D-cover vent. In an embodiment the blower fan system may include one or more blower fan outlet apertures to push air into the base chassis and operate with other elements of a thermal control system in the information handling system. Other outlet or exhaust vents may also be formed along the D-cover at the sides or top of the base chassis or any other cover of the information handling system to allow for air to be expelled out of the information handling system.

The arrangements of the blower fan system described herein allows for the maximum height of blower fan system being placed within the information handling system even when the overall thickness of the information handling system (e.g., thickness of a keyboard support chassis) is being reduced to reduce the overall thickness of the information handling system and in particular a base chassis. As the thickness of the information handling system is being reduced, the space within the information handling system used to house the blower fan system is also reduced. In some example embodiments, the thickness of the blower fan system itself is reduced to fit within the smaller areas created in these thinner information handling systems. This may reduce the ability of the blower fan system to cool the elements within the information handling system base chassis such as one or more processors, power systems, radio frequency (RF) system, or other components. The thickness of the blower fan system may need to be further reduced as the thickness of the information handling system is reduced in order to provide for a fan gap between the blades of the blower fan system and blower fan housing or a D-cover used to house the blower fan system and other components of the information handling system. In previous information handling systems, this fan gap may be as wide as 1 mm to 2 mm further reducing the height of the blower fan system so that the blower fan system is to be kept away from the D-cover. The blower fan system is kept away from the D-cover so as to avoid damage to the blower fan system if and when the D-cover is deflected into the blower fan system and the fan blades by application of force to the base chassis during use. Because the thickness of the information handling system base chassis may be in a range of 4.5 mm to 8 mm, in example embodiments, a reduction in height of 1 mm to 2 mm may be a significant reduction in usable space within the information handling system. By including the blower fan system according to various embodiments as described herein with a fan support rod, the thickness of the blower fan system may be increased with a fan gap (e.g., a gap between the bottom of the blower fan system and the D-cover) reduced with the structural support at the blower fan housing. As a result, the thickness of the information handling system may be reduced without sacrificing fan height which relates to blower fan system performance.

In addition to providing better use of space within the information handling system, the blower fan system described herein may increase the amount of cooling provided to the components by allowing greater fan blade height for the space allocated for the blower fan system of the information handling system. In an embodiment, the use of the blower fan system may increase the amount of air passed through the information handling system. This may increase the ability of the fan to cool the components of the information handling system while also decreasing the use of the blower fan system as the components are cooled when kept under a particular temperature.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and can vary in size, shape, performance, price, and functionality.

In a specific embodiment, the information handling system 100 is described herein as being a notebook-type computing device. These types of information handling systems 100 may include a series of chassis (e.g., a metal chassis) used to encase the components of the information handling system 100. For example, the chassis may include an A-cover (e.g., a top cover or a lid cover) functioning to enclose a portion of the information handling system 100. In this embodiment, the chassis may further include a B-cover (e.g., a bezel or other display cover) functioning to enclose a video or digital display device. Here, the A-cover and the B-cover may be joined together in an embodiment to form a fully enclosed display chassis of the notebook-type information handling system 100. In this embodiment, the chassis may further include a C-cover (e.g., a palm rest cover) housing a keyboard, touchpad, and any cover in which these components are set. The chassis may also include a D cover base housing for the notebook-type information handling system 100 (e.g., a bottom cover). The C cover and the D cover may be joined together to form a fully enclosed base chassis. The chassis in some embodiments described herein may be coupled together via a hinge operably connecting the display chassis (e.g., the A-cover and B-cover assembly) with the base chassis (e.g., C-cover and the D-cover assembly) so as to place the base chassis of the notebook-type information handling system 100 in a plurality of configurations with respect to the digital display enclosed within the display chassis.

Although the present specification describes the information handling system as including a display chassis and base chassis in the form of a laptop-type information handling system, the present specification also contemplates that the information handling system may be in the form of a dual-screen information handling system or bendable/flexible single screen information handling system. A dual screen information handling system may include a first display screen and a second display screen being connected via a hinge. A bendable/flexible single screen information handling system may include a bendable or foldable display for displaying user output and receiving user input.

Because of the transportability of these notebook-type information handling systems 100, the weight and certain dimensions of these information handling systems 100 are to be reduced to make handling easier by the user. The weight of size of the information handling system 100 may be reduced by making the display chassis and, more specifically, the base chassis thinner. The base chassis may be a location within the information handling system 100 where the blower fan system is placed to cool one or more heat producing components. However, by making the base chassis thinner, the ability of a blower fan system to cool and maintain temperatures within the base chassis is reduced due to the reduced size of the blower fan system that can be placed within the thinner base chassis. Indeed, previous fan systems may be further reduced so that movement of the D-cover into the blower fan system does not cause the interior surface of the D-cover to mechanically interface with the blades of the blower fan system causing damage. The space between the blower fan system and the D-cover, often called the air gap, may be sufficient such that bending of the D-cover into the interior of the base chassis at the location of the blower fan system does not cause blower fan housing or the interior of the D-cover to come in contact with the blades of the blower fan system. This air gap further reduces the size of the blower fan system, thereby reducing the ability of the blower fan system to maintain appropriate temperatures within the base chassis of the information handling system 100. Embodiments of the present disclosure may provide for minimizing the air gap by providing structural reinforcements to avoid fan blade collisions.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources 102, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices 112, such as a keyboard 114, a mouse 116, a video/graphic display 110, or any combination thereof. The information handling system 100 can also include one or more buses 108 operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 associated with the main memory 104, static memory 106 and processor 102, and drive unit 118 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input, and a keyboard 114. The information handling system 100 can also include a disk drive unit 118.

The network interface device 120 may provide connectivity to a network 126, e.g., a wide area network (WAN), a local area network (LAN), wireless local area network (WLAN), a wireless personal area network (WPAN), a wireless wide area network (WWAN), or other networks. Connectivity may be via wired or wireless connection. The network interface device 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links. The network interface device 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In an embodiment, the information handling system 100 includes a power management unit (PMU) 152 that provides power to the various electrical components formed within the information handling system 100 such as the fan module 138, blower fan system 128, processor 102, main memory 104, static memory 106, video display 110, input device 112, and drive unit 118, among others. The PMU 152 may manage power passed from a battery 154 to these components as well as direct power from an alternating current (A/C) power source 156. The PMU 152 may be communicatively coupled to the processor 102 via the bus 108 in order to allow the control of the fan module 138 and blower fan system 128 by the processor 102, controllers or other drivers.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 126 can communicate voice, video or data over the network 126. Further, the instructions 124 may be transmitted or received over the network 126 via the network interface device or wireless adapter 120.

The information handling system 100 can include a set of instructions 124 that can be executed to cause the computer system to perform any one or more of the methods or computer-based functions disclosed herein. For example, instructions 124 may execute a fan module 140, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 118 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 118 and static memory 106 may also contain space for data storage. Further, the instructions 124 may embody one or more of the methods or logic as described herein. For example, instructions relating to the fan module 140 software algorithms, processes, and/or methods may be stored here. In a particular embodiment, the instructions, parameters, and profiles 124 may reside completely, or at least partially, within the main memory 104, the static memory 106, and/or within the disk drive 118 during execution by the processor 102 of information handling system 100. As explained, some or all of the fan module 140 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The fan module 140 may be stored in static memory 106, or the drive unit 118 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

As described, the information handling system 100 may include a fan module 140 that may be operably connected to the bus 108. The computer readable medium 122 associated with the fan module 140 may also contain space for data storage. The fan module 140 may, according to the present description, perform tasks related to operating the blower fan system 128. In some embodiments, the fan module 140 may, upon execution of the processor 102, cause signals to be sent to the blower fan system 128 to operate the fan during when certain circumstances are met. By way of example, the fan module 140 may cause the blower fan system 128 and specifically the cylindrical main shaft 132 to turn when the processor 102 has received a signal descriptive of a high temperature within the information handling system 100. The temperature may be detected via, for example, a temperature sensor (not shown) within the information handling system 100. In another embodiment, the fan module 140 may send the signals to the blower fan system 128 to operate based on a threshold number of processes being executed by the processor 102. Because the blower fan system 128 is meant to cool down certain elements within the information handling system 100 and specifically the processor 102, the number of processes executed by the processor 102 may be indicative of an anticipated rise in temperature within the information handling system 100. Other methods may be implemented by the processor 102 and fan module 140 that cause the fan module 140 to direct the operation of the blower fan system 128 and the present specification contemplates the use of these other methods.

The information handling system 100 may include other thermal regulating components used to cool the system along with the blower fan system 128. These additional thermal regulating components may include heat sinks, heat pipes, exhaust vents, vapor chambers, along with other cooling devices. In an embodiment, the blower fan system 128 may create an air flow through the information handling system 100 to these other thermal regulating components and increase the efficiency of the thermal regulating capabilities of those other thermal regulating components.

In an embodiment, the fan module 140 may communicate with the main memory 104, the processor 102, the video display 110, the any input/output device 112, and the network interface device 120 via bus 108, and several forms of communication may be used, including ACPI, SMBus, a 24 MHZ BFSK-coded transmission channel, or shared memory. Driver software, firmware, controllers and the like may communicate with applications on the information handling system 100.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In an embodiment, the blower fan system 128 may include a cylindrical bearing 130. The cylindrical bearing 130 may have an internal cylindrical cavity, but may be any other shape externally to accommodate a structure of the blower fan 128. Although an exterior surface of the cylindrical bearing 130 is described as being cylindrical, alternative embodiments include a cylindrical bearing 130 that has an exterior surface shape of a square or hexagon. In an embodiment, cylindrical bearing 130 may be coupled to other structural devices within the information handling system such as a C-cover, a keyboard support chassis or D-cover. The cylindrical bearing 130 may be part of the mechanical structure provided within the blower fan system 128 during the operation of the blower fan system 128. In an embodiment, the cylindrical bearing 130 may be used as the structural support for a printed circuit board (PCB) used to house any circuitry used to control the operation of the blower fan system 128. In an embodiment, the cylindrical bearing 130 is in the form of a sleeve bearing that includes a cylindrical hole used to retain the cylindrical main shaft in a position. This sleeve bearing 130 may include any lubricant may be used in connection with any sleeve bearing (or ball bearing, roller bearing, or fluid bearing described herein) to allow for reduced friction between the sleeve bearing 130 and the main shaft. The lubricant may be a silicone grease, oil, or other friction reducing fluids.

In a specific embodiment, the PCB may include circuitry that electrically couples a processor of the blower fan system 128 with, for example, an electromagnet structurally supported by the cylindrical bearing 130 and the PCB. As described herein, a processor 102 executing the fan module 138 may be used to control the operation of the blower fan system 128 based on, for example, detected temperatures within the information handling system or processes executed by the processor. Upon the receipt of signals from the processor, the circuitry of the PCB may be used to selectively activate the electromagnet so that a permanent magnet or magnets mechanically coupled to the set of fan blades 134 may be turned. In this specific embodiment, as power is passed through the electromagnet, a magnetic field is created that interacts with a magnetic field of the permanent magnet mechanically coupled to the set of fan blades 134. In these embodiments, the activation of the electromagnet may be sequential such that different sets of electromagnets mechanically coupled to the PCB cylindrical bearing 130 are "fired" sequentially so that the permanent magnets and the set of fan blades 134 are rotated about the cylindrical bearing 130. Other components may be present in the blower fan system 128 that provides for the optimal operation of the blower fan system 128 and the present specification contemplates these additional devices. For example, inductive coil drive fan motors may be used in some embodiments.

In the embodiments described herein, the cylindrical bearing 130 includes a cylindrical hollow receiving portion extending from a top of the cylindrical bearing 130 to the bottom of the cylindrical bearing 130. This cylindrical hollow receiving portion may allow for a cylindrical main shaft 132 to be placed therein. In a specific embodiment, the cylindrical bearing 130 may interface with the cylindrical main shaft 132 mechanically using a bearing or other type of coupling device that allows the cylindrical main shaft 132 to rotate within the hollow of the cylindrical bearing 130. In an alternative embodiment, the cylindrical main shaft 132 may be held up vertically from, for example, the D-cover via the interaction (e.g., magnetic attraction) between the electromagnet on the cylindrical bearing 130 and the permanent magnets placed on the set of fan blades 134.

The cylindrical main shaft 132 may also include an internal shaft pass-through hollow cavity portion extending from a top of the cylindrical main shaft 132 to the bottom of the cylindrical main shaft 132. As described, the information handling system 100 includes the blower fan system 128 that is designed such that a maximum height of the fan may be realized. This is accomplished by preventing any portions of the D-cover or blower fan housing from entering into the rotation of the set of fan blades 134. In order to prevent the deflection of the D-cover, the blower fan system 128 of the information handling system 100 may include a fan support rod 136. In the embodiments described herein, the fan support rod 136 is passed through the shaft pass-through hollow portions formed through the cylindrical main shaft 132 and cylindrical bearing 130. This through hole allows the fan support rod 136 to structurally support the chassis or area into which the blower fan system 128 is placed. By structurally supporting the volume within the information handling system 100 the blower fan system 128 has been placed within, the fan support rod 136 prevents the D-cover or any other portion of any chassis of the information handling system 100 from compressing or deflecting and coming into contact with the set of fan blades 134. With the fan support rod 136, the height of the set of fan blades 134 mechanically coupled to the cylindrical main shaft 132 may be increased due to the elimination of the need of an air gap between the bottom edges of the set of fan blades 134 and the D-cover to avoid fan blade contact.

Without the use of the shaft pass-through hollow portions of the cylindrical main shaft 132, cylindrical bearing 130, and the fan support rod 136, an air gap between the bottom edge of the set of fan blades 134 and the D-cover may be as high as 2 mm. As a result of this, the height of the fan blades 134 that may be placed within the information handling system 100 is decreased. Because the airflow produced by the fan is roughly proportional to the height of the fan blades, an increase in the height of the fan blades will increase the proportional airflow produced by the blower fan system thereby increasing the thermal cooling capabilities of the blower fan system generally. By eliminating or substantially reducing the previously-described air gap through the use of the fan support rod 136 and hollow pass-through cavities in the cylindrical main shaft 132 and cylindrical bearing 130, the height of the blower fan system 128 may be increased. This increases the airflow into the blower fan system 128, out of the blower fan system 128, and throughout the information handling system 100 in order to increase the thermal cooling capabilities of the blower fan system 128. By increasing the thermal cooling capabilities of the blower fan system 128, the wear and tear on the blower fan system 128 and other components of the information handling system 100 may be decreased by the decreased rates of operation of the blower fan system 128 or more efficient cooling.

In some embodiments, an air gap may also exist between the top edges of the set of fan blades 134 and the keyboard or keyboard support chassis. Similar to the air gap between the bottom edges of the set of fan blades 134 and the D-cover, this second air gap may decrease the height of the fan thereby proportionately decreasing the ability of the fan to cool the interior of the information handling system 100. Because the fan support rod 136 is placed between the D-cover and the keyboard 114 and/or keyboard support chassis the actuation of any keys on the keyboard 114 does not allow the keyboard 114 and/or keyboard support chassis to be deflected down into the blower fan system 128 and contacting the set of fan blades 134. Thus, an increase in fan blade size may further be realized relative to previous fan systems without accommodation for a fan support rod 136.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
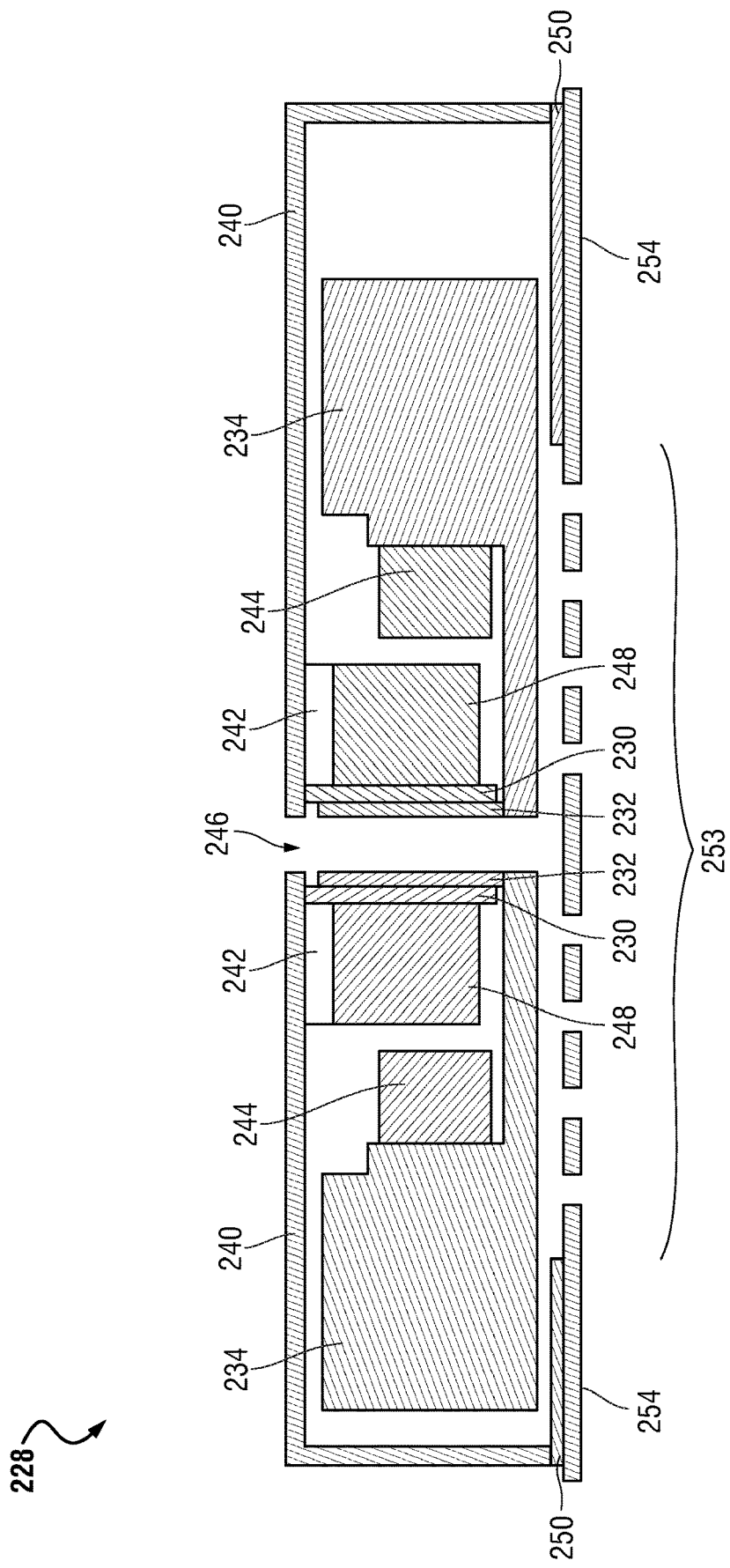
FIG. 2 is a graphical illustration of a side, cut-out view of a blower fan system according to an embodiment of the present disclosure.

FIG. 2 is a graphical illustration of a side, cut-out view of a blower fan system 228 according to an embodiment of the present disclosure. The blower fan system 228 shown in FIG. 2 may be used to cool any information handling system device described herein. The blower fan system 228 may be placed within any information handling system or any other system that may be cooled by the operation of the blower fan system 228 by moving air from an air inlet vent through a chassis space and exit exhaust vents in the information handling system chassis. The present specification describes a specific embodiment where the blower fan system 228 is placed within a notebook-type information handling system. In this embodiment, the blower fan system 228 may include a top fan chassis 240 and a bottom fan chassis 250 to house the blower fan system 228 which may be installed within a chassis of the notebook-type information handling system. Each of the top fan chassis 240 and bottom fan chassis 250 may be mechanically coupled to other portions of the information handling system chassis in an embodiment and serve to move air within the chassis to cool heat producing components such as a processor, power systems, RF systems, or the like.

Again, the information handling system may include other thermal regulating components used to cool the system along with the blower fan system 228. These additional thermal regulating components may include heat sinks, heat pipes, exhaust vents, vapor chambers, along with other cooling devices. In an embodiment, the blower fan system 228 may create an air flow through the information handling system to these other thermal regulating components and increase the efficiency of the thermal regulating capabilities of those other thermal regulating components.

In an alternative embodiment, the top fan chassis 240 and bottom fan chassis 250 may be eliminated with a keyboard support chassis that may serve as the top fan chassis 240 or a D-cover serving as the bottom fan chassis 250. As described, the bottom fan chassis 250 and top fan chassis 240 are prevented by the fan support rod (not shown) from bending into the cavity formed between the and housing the blower fan system 228. FIG. 2 shows a depiction of a specific arrangement of elements of the blower fan system 228. However, the present specification contemplates other physical arrangements of the elements of the blower fan system 228 as well as the addition of other elements without materially departing from the novel teachings and advantages of the embodiments of the present disclosure. The present specification further contemplates that the blower fan system 228 may be oriented within the housings of the information handling system. The embodiments described herein, show the orientation of the blower fan system 228 under the C-cover with an inlet vent formed within the D-cover. In other embodiments, the orientation of the blower fan system 228 may be such that an inlet vent is formed in the C-cover with air being drawn downward into the blower fan system 228.

In this embodiment, the blower fan system 228 may include a cylindrical bearing 230. The cylindrical bearing 230 may include a cylindrical hollow receiving portion extending from a top of the cylindrical bearing 230 to the bottom of the cylindrical bearing 230. As will be described herein, the cylindrical hollow receiving portion of the cylindrical bearing 230 may form a through-hole 246 through which a fan support rod may be passed. In an embodiment, the cylindrical bearing 230 may include a hollow tube that is mechanically coupled to the top fan chassis 240 or other chassis as described herein.

The blower fan system 228 may also include a printed circuit board (PCB) 242. The PCB 242 may include circuitry that electrically couples a processor of the information handling system with an electromagnet 248 or a series of electromagnets 248. The permanent magnet 244 and electromagnet 248 form a magnetic drive system to drive the rotation of the fan blades 234. It is understood that other electric motors, such as inductive motors, may be used to drive fan the blades 234 in other embodiments. By coupling the processor with the electromagnet 248, the PCB 242 may control the activation of the electromagnet 248 during operation of the blower fan system 228. The activation of the electromagnets 248 during operation of the blower fan system 228 causes magnetic movement in the permanent magnets 244 of same or opposite polarity. The sequential activation of the electromagnets 248 may cause the set of fan blades 234 and cylindrical main shaft 232 to rotate about the PCB 242 and electromagnet 248 thereby creating an airflow through the blower fan system 228. Airflow is drawn in through an inlet vent 253 in FIG. 2 and pushed into or out of the page of the cross-section of the blower fan system 228 in some example embodiments.

The blower fan system 228 also includes the cylindrical main shaft 232 as described herein. The cylindrical main shaft 232 includes a shaft pass-through hollow portion extending from a top of the cylindrical main shaft 232 to the bottom of the cylindrical main shaft 232. Similar to the cylindrical bearing 230, the cylindrical main shaft 232 also forms a through-hole 246 through which a fan support rod (not shown) may be passed. In an embodiment, the cylindrical bearing 230 may include a hollow tube that is operatively coupled to the cylindrical main shaft 232 via bearings such as sleeve bearings, ball bearings, roller bearings, or other support that allows the cylindrical main shaft 232 to rotate freely within the cylindrical bearing 230 while being coupled to the interior surface of the cylindrical bearing 230 preventing vertical sliding in some embodiments. In an alternative embodiment, the cylindrical main shaft 232 is held in place by other means such as magnetic means, a bottom rotating support placed below the cylindrical main shaft 232, and a fluid bearing (e.g., the main shaft 232 is supported by a layer of fluid), among others. In a sleeve bearing, a very precise cavity in the cylindrical bearing 230 may be formed to accommodate a precisely sized cylindrical main shaft 232 such that with lubricant the is limited friction during rotation of the fan blades about the sleeve bearing in the cylindrical bearing in some embodiments as described herein.

In an embodiment, the bottom fan chassis 250 may be a part of a D-cover used to, with a C-cover, house the blower fan system 228 within a chassis of the information handling system. In this embodiment, a portion of the D-cover below the blower fan system 228 may have a number of holes or slats formed therein to create a D-cover vent 253 that allows the air to pass through the D-cover vent 253, into the blower fan system 228 and throughout the information handling system. Because the D-cover 254 at the D-cover vent 253 may structurally weak, the D-cover 254 may be relatively more deformable at the D-cover vent 253. Because of this, when a force is applied to the D-cover vent 253 either purposefully or accidentally, the D-cover 254 may be prevented from deforming inward and damaging the blower fan system 228 as a result of the arrangement of the fan support rod within the through-hole 246. In some embodiments, the fan support rod may prevent any deformation of the D-cover 254 into the blower fan system 228 based on the rigidity of the fan support rod.

Again, the present specification further contemplates that the blower fan system 228 may be oriented within the housings of the information handling system. The embodiments described herein, show the orientation of the blower fan system 228 under the C-cover with an inlet vent formed within the D-cover. In other embodiments, the orientation of the blower fan system 228 may be such that an inlet vent 253 is formed in the C-cover with air being drawn downward into the blower fan system 228.

Figure 3:
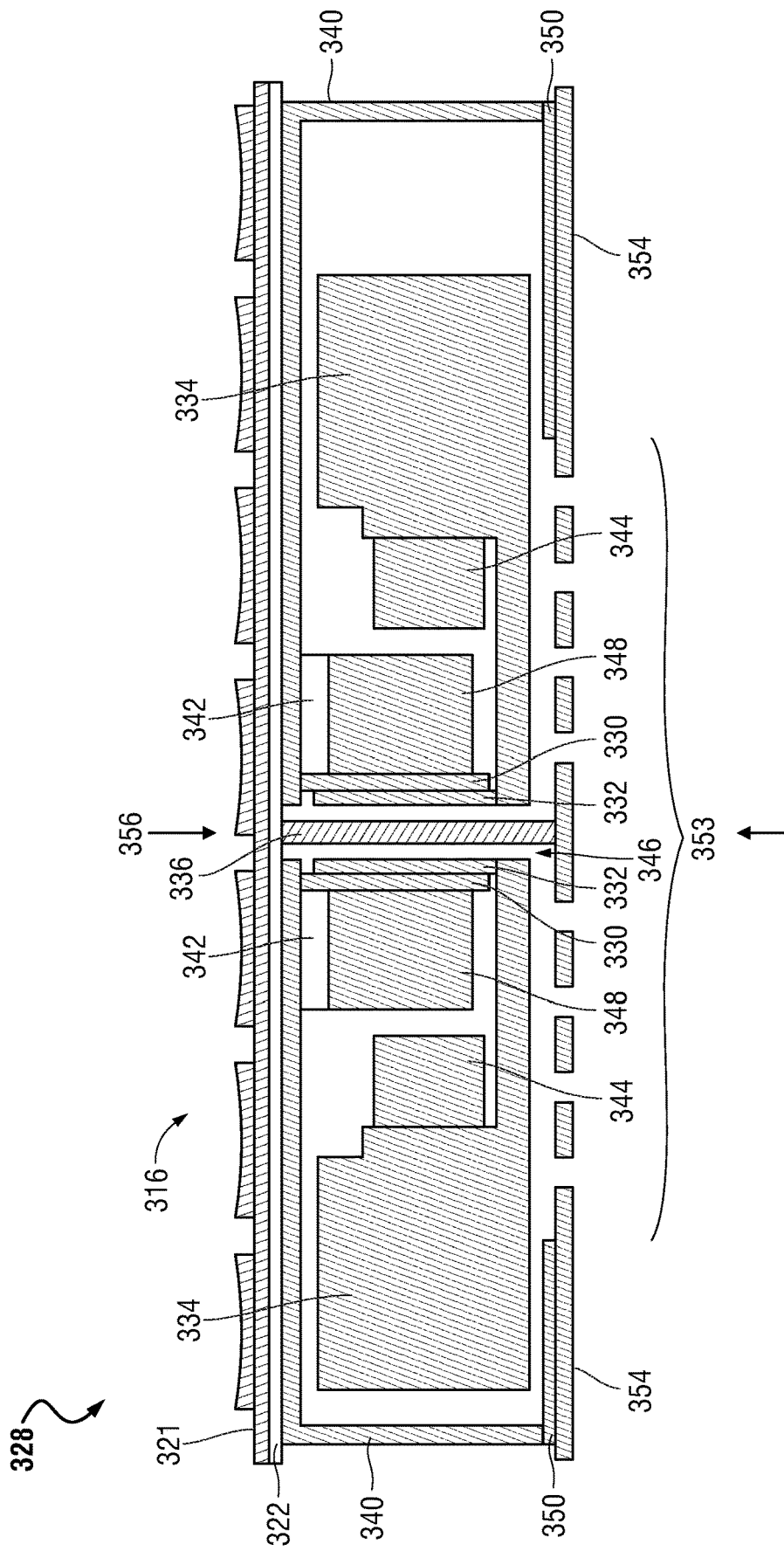
FIG. 3 is a graphical illustration of a side, cut-out view of a blower fan system according to another embodiment of the present disclosure.

FIG. 3 is a graphical illustration of a side, cut-out view of a blower fan system 328 according to another embodiment of the present disclosure. The blower fan system 328 shown in FIG. 3 may be used to cool any device descried herein. The blower fan system 328 may be placed within any information handling system or any other system that may be cooled by the operation of the blower fan system 328. The present specification describes a specific embodiment where the blower fan system 328 is placed within a notebook-type information handling system. In this embodiment, the blower fan system 328 may include a top fan chassis 340 and a bottom fan chassis 350 to house the blower fan system 328 within a chassis of the notebook-type information handling system having heat producing components. Each of the top fan chassis 340 and bottom fan chassis 350 may be mechanically coupled to other portions of the information handling system in an embodiment. In an alternative embodiment, the top fan chassis 340 and bottom fan chassis 350 may be eliminated with a keyboard support chassis serving as the top fan chassis 340 and the D-cover 354 serving as the bottom fan chassis 350. As described, the bottom fan chassis 350 and top fan chassis 340 are prevented, by the fan support rod 336, from bending into the cavity formed by a housing for the blower fan system 328 from contacting the rotating fan blades 334. FIG. 3 shows a depiction of a specific arrangement of elements of the blower fan system 328. However, the present specification contemplates other physical arrangements of the elements of the blower fan system 328 as well as the addition of other elements without materially departing from the novel teachings and advantages of the embodiments of the present disclosure. Again, the present specification further contemplates that the blower fan system 328 may be oriented within the housings of the information handling system. The embodiments described herein, show the orientation of the blower fan system 328 under the C-cover with an inlet vent formed within the D-cover. In other embodiments, the orientation of the blower fan system 328 may be such that an inlet vent 353 is formed in the C-cover with air being drawn downward into the blower fan system 328.

As described herein, the information handling system may include a number of chassis including an A-cover (not shown), a B-cover (not shown), a C-cover 322, and a D-cover 354. The A-cover and the B-cover may be joined together in an embodiment to form a fully enclosed display chassis (not shown) of the notebook-type information handling system. The C-cover 322 and the D-cover 354 may be joined together to form a fully enclosed base chassis. These chassis described herein may be coupled together via a hinge operably connecting the display chassis (e.g., the A-cover and B-cover assembly) with the base chassis (e.g., C-cover 322 and the D-cover 354 assembly) so as to place the base chassis of the notebook-type information handling system 100 in a plurality of configurations with respect to a digital display enclosed within the display chassis. The C-cover 322 may house a keyboard 316 used by a user of the information handling system to provide input. The keyboard 316 may include any number of keys that form, for example, a QWERTY-type keyboard. Any number of keys may be used to form the keyboard 316 and the present specification contemplates that any other type of input device may be incorporated into the keyboard 316 such as a trackpad.

In this embodiment, the blower fan system 328 may include a cylindrical bearing 330 having a cylindrical pass-through hollow portion but may be any external shape. The cylindrical bearing 330 may include a shaft pass-through hollow portion extending from a top of the cylindrical bearing 330 to the bottom of the cylindrical bearing 330. The cylindrical hollow receiving portion of the cylindrical bearing 230 may form a through-hole 346 through which a fan support rod 336 may be passed and a cylindrical main shaft 332 may be inserted and rotate. In an embodiment, the cylindrical bearing 330 is in the form of a hollow tube that is mechanically coupled to the C-cover 322, fan chassis, or other chassis as described herein such as a dedicated top fan chassis 340.

The blower fan system 328 also includes a printed circuit board (PCB) 342. The PCB 342 may include circuitry that electrically couples a processor of the information handling system such as a fan module with an electromagnet 348 or a series of electromagnets 348. The permanent magnet 344 and electromagnet 348 form a magnetic drive system to drive the rotation of the fan blades 334. It is understood that other electric motors, such as inductive motors, may be used to drive fan the blades 234 in other embodiments. By coupling the processor with the electromagnet 348, the PCB 342 may control the activation of the electromagnet 348 during operation of the blower fan system 328. The activation of the electromagnet 348 during operation of the blower fan system 328 causes magnetic movement in the permanent magnets 344 of same or opposite polarity to cause the set of fan blades 334 and cylindrical main shaft 332 to rotate about the PCB 342 and electromagnet 348. This creates an airflow through the blower fan system 328 and out of one or more blower fan apertures.

The blower fan system 328 also includes the cylindrical main shaft 332 as described herein. The cylindrical main shaft 332 also includes a shaft pass-through hollow portion extending from a top of the cylindrical main shaft 332 to the bottom of the cylindrical main shaft 332. Similar to the cylindrical bearing 330, the cylindrical main shaft 332 also forms a through-hole 346 through which a fan support rod 336 is passed. In an embodiment, the cylindrical main shaft 332 is in the form of a hollow tube that is mechanically coupled to the cylindrical bearing 330 via sleeve bearings, fluid bearings, ball bearings, roller bearings, and or other support that allows the cylindrical main shaft 332 to rotate freely within the cylindrical bearing 330 while being mechanically coupled to the interior surface of the cylindrical bearing 330 and not fall towards the bottom fan chassis 350 and D-cover 354 due to gravity. Through hole 346 allows the cylindrical main shaft 332 to rotate without contacting the support rod 336.

In an embodiment, the bottom fan chassis 350 may be a part of the D-cover 354 used to, with the C-cover 322, or top fan chassis, or keyboard support plate 322 to house the blower fan system 328 within the information handling system. In this embodiment, a portion of the D-cover 354 below the blower fan system 328 may have a number of holes or slats formed therein to create a D-cover vent 353 that allow the air to pass through the D-cover vent 353, into the blower fan system 328 and throughout the information handling system. Because the D-cover at the D-cover vent 353 is structurally weak, the D-cover 354 may be relatively more deformable at the D-cover 354. Because of this, when an upward force 358 is applied to the D-cover vent 353 either purposefully or accidentally, the D-cover may be prevented from deforming into the fan blades 334 and damaging the blower fan system 328 as a result of the arrangement of the fan support rod 336 within the through-hole 346. In some embodiments, the fan support rod 336 may prevent any deformation of the D-cover 354 into the blower fan system 328 based on the rigidity of the fan support rod 336. Similarly, as the user presses against any of the keys of the keyboard 352, the keyboard 352 and/or keyboard support chassis may be deformed into the blower fan system 328 in a downward direction 356. This deformation, however, is also prevented from deforming into the fan blades 334 through the placement of the fan support rod 336 within the through-hole 346. In an embodiment, the fan support rod 336 may be a rigid material such as metal, plastic, carbon fiber, or other similar materials and may be tubular in some embodiments.

Figure 4:
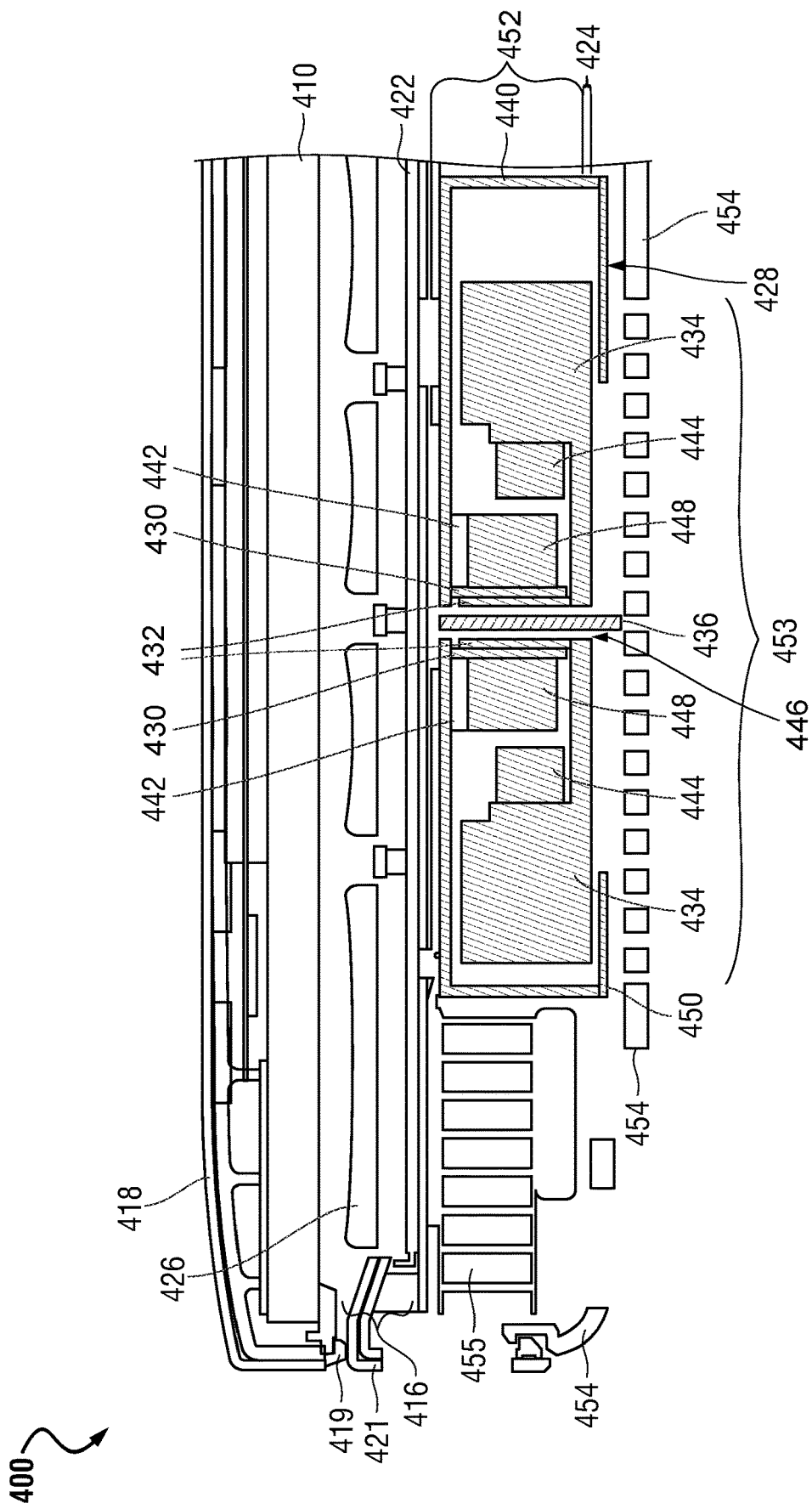
FIG. 4 is a graphical illustration of a side, cut-out view of an information handling system including a blower fan system according to another embodiment of the present disclosure.

FIG. 4 is a graphical illustration of a side, cut-out view of an information handling system 400 including a blower fan system 428 according to another embodiment of the present disclosure. The information handling system 400 shown in FIG. 4 is shown as a notebook-type information handling system 400.

The information handling system 400 includes a number of chassis portions including an A-cover 418, a B-cover 419, a C-cover 421, and a D-cover 454. The A-cover 418 and the B-cover 419 may be joined together in an embodiment to form a fully enclosed display chassis of the notebook-type information handling system 400. The display chassis may house a video display 410 that can provide output to the user. Other devices may be housed within the display chassis such as a camera among others. The C-cover 421 and the D-cover 454 may be joined together to form a fully enclosed base chassis. Along with the blower fan system 428, the base chassis may house any number of devices and elements such as a mother board, a bus system, processors (e.g., GPU/CPU), a memory devices, a keyboard 416, a trackpad, power systems, an antenna, and a network interface device, among other elements.

The display and base chassis described herein may be coupled together via a hinge (not shown) operably connecting the display chassis (e.g., the A-cover 418 and B-cover 419 assembly) with the base chassis (e.g., C-cover 421 and the D-cover 454 assembly) so as to enable the base chassis of the notebook-type information handling system 400 placed in a plurality of configurations with respect to the video display 410 enclosed within the display chassis such as with a convertible laptop information handling system in some embodiments. The C-cover 421 may house the keyboard 416 used by a user of the information handling system to provide input. The keyboard 416 may include any number of keys 426 that form, for example, a QWERTY-type keyboard. Any number of keys 426 may be used to form the keyboard 416 and the present specification contemplates that any other type of input device may be incorporated into the keyboard 416 such as a trackpad.

In this embodiment, the blower fan system 428 may include a cylindrical bearing 430. The cylindrical bearing 430 may include a cylindrical hollow receiving cavity portion extending from a top of the cylindrical bearing 430 to the bottom of the cylindrical bearing 430. The cylindrical hollow receiving cavity portion of the cylindrical bearing 430 may form a through-hole 446 through which a fan support rod 436 may be passed. In an embodiment, the cylindrical bearing 430 is in the form of a hollow tube that is mechanically coupled to the C-cover 421 or other chassis as described herein such as a dedicated top fan chassis 440. The cylindrical bearing 430 may be any external shape to facilitate mechanical attachment, such as a press fit or other attachment to the top fan chassis 440 and to accommodate the keyboard chassis 422. Fan support rod 436 may extend between a keyboard chassis 422 in some embodiments as shown and to D-cover 454 at a grill or other portion of the D-cover 454 at a D-cover vent inlet 453. In other embodiments, fan support rod 436 may be anchored on top at the C-cover 421, such as if not disposed under a keyboard. In other embodiments, fan support rod 436 may be anchored at the top or bottom at a fan housing such as 440 or 450.

The blower fan system 428 also includes a PCB 442. The PCB 442 may include circuitry that electrically couples a processor (not shown) of the information handling system 400 and its components such as a fan module, drivers, and a thermal control system with an electromagnet 448 or a series of electromagnets 448. The electromagnet 448 and permanent magnet 444 coupled to the set of fan blades 434 form a magnetic drive system to drive rotation of the set of fan blades 434. By coupling the processor with the electromagnet 448, the PCB 442 may control the activation of the electromagnet 448 during operation of the blower fan system 428.

The activation of the electromagnet 448 during operation of the blower fan system 428 may cause the set of fan blades 434 and cylindrical main shaft 432 to rotate about the PCB 442 and electromagnet 448 thereby creating an airflow through the blower fan system 428 form D-cover vent inlet 453 through an outlet aperture or apertures formed by a top fan chassis 440 and bottom fan chassis 450.

The blower fan system 428 also includes the cylindrical main shaft 432 as described herein. The cylindrical main shaft 432 includes a shaft pass-through hollow portion extending from a top of the cylindrical main shaft 432 to the bottom of the cylindrical main shaft 432. Similar to the cylindrical bearing 430, the cylindrical main shaft 432 may form a through-hole 446 through which a fan support rod 436 is passed. In an embodiment, the cylindrical bearing 430 is in the form of a hollow tube that is mechanically coupled to receive the cylindrical main shaft 432. The cylindrical main shaft 432 is received in place vertically and able to rotate via a ball bearing, roller bearing, or other support that allows the cylindrical main shaft 432 to rotate freely within the cylindrical bearing 430 while being mechanically coupled to the interior surface of the cylindrical bearing 430. In an alternative embodiments, the cylindrical main shaft 432 is held in place by other means such as magnetic means, a bottom rotating support placed below the cylindrical main shaft 432, among others.

In an embodiment, the bottom fan chassis 450 may be a part of the D-cover 454 forming a monolithic piece in place of a separate bottom fan chassis 450. The D-cover 454 is used to, with the top fan chassis 440, house the blower fan system 428 within the information handling system 400. In this embodiment, a portion of the D-cover 454 below the blower fan system 428 has a number of holes or slats formed therein to create a D-cover vent 422 that allow the air to pass through the D-cover vent inlet 453, into the blower fan system 428 and throughout the information handling system. Because the D-cover 454 at the D-cover vent inlet 453 may be structurally weak, the D-cover 454 may be relatively more deformable at the D-cover vent inlet 453. Thus, when a force is applied to the D-cover vent inlet 453 either purposefully or accidentally, the D-cover 454 may be prevented from damaging the blower fan system 428 and rotating blades 434 as a result of the arrangement of the fan support rod 436 within the through-hole 446. In some embodiments, the fan support rod 436 may prevent any deformation of the D-cover 454 into the blower fan system 428 and having space for fan blade 434 rotation based on the rigidity of the fan support rod 436.

In an embodiment, the top fan chassis 440 may be mechanically coupled to a keyboard chassis 422. The top fan chassis 440 may be coupled to the keyboard chassis 422 using any type of adhesive or any type of mechanical fastener. In an embodiment, the top fan chassis 440 is not present and, instead, the keyboard chassis 422 is used to secure the cylindrical bearing 430 thereto.

As described herein, the blower fan system 428 has a blower fan height 452 that is generally defined by the size of the information handling system 400 and the available space within the information handling. As the trend is to reduce the overall thickness of the information handling system 400 and the base chassis, the blower fan height 452 of the blower fan system 428 may also be reduced. The blower fan system 428 described herein reduces the size of an air gap 424 needed by physically preventing any deformations of the D-cover vent inlet 453 upward and into the set of fan blades 434 through the use of the fan support rod 436. Because the fan support rod 436 is mechanically coupled to one or more of the top fan chassis 440, D-cover 454, or some bottom fan chassis 450, the fan support rod 436 prevents either the D-cover vent inlet 453 or a portion of the C-cover 421 or keyboard chassis 422 from deflecting into the blower fan system 428 thereby preventing damage to the fan.

In the embodiment shown in FIG. 4, the air gap 424 may be as small as 0.5 mm so that an increase in blower fan height 452 of the blower fan system 428 may be realized while risk of damage to the set of fan blades 434 is reduced. Because there will be no deflection of the keyboard 416 or D-cover vent inlet 453 into the blower fan system 428 the air gap may be significantly decreased from 1.9 mm to the 0.5 mm thereby increasing the overall blower fan height 452 of the set of fan blades 434 within the space defined by the blower fan height 452 of the blower fan system 428. With this increase in blower fan height 452 (e.g., about a 30% increase in one example of a thin base chassis), the blower fan system 428 provides more airflow (e.g., between an 18% and 30% increase) into and out of the blower fan system 428 at outlet apertures (not show in cross-section) in order to significantly increase the capability of the blower fan system 428 to cool the interior of the information handling system 400.

During operation of the blower fan system 428, air may be drawn into the D-cover vent inlet 453 by the blower fan system 428. The air may be distributed throughout the base chassis of the information handling system 400 via a blower fan outlet aperture or a plurality of fan outlet apertures to cool those heat producing components along with any thermal system components (e.g., heat sinks, heat pipes, exhaust vents, vapor chambers, etc.). Air may be exhausted from the base chassis of the information handling system 400 such as an exhaust vent 455 shown in FIG. 4 along a side of the base chassis.

Figure 5:
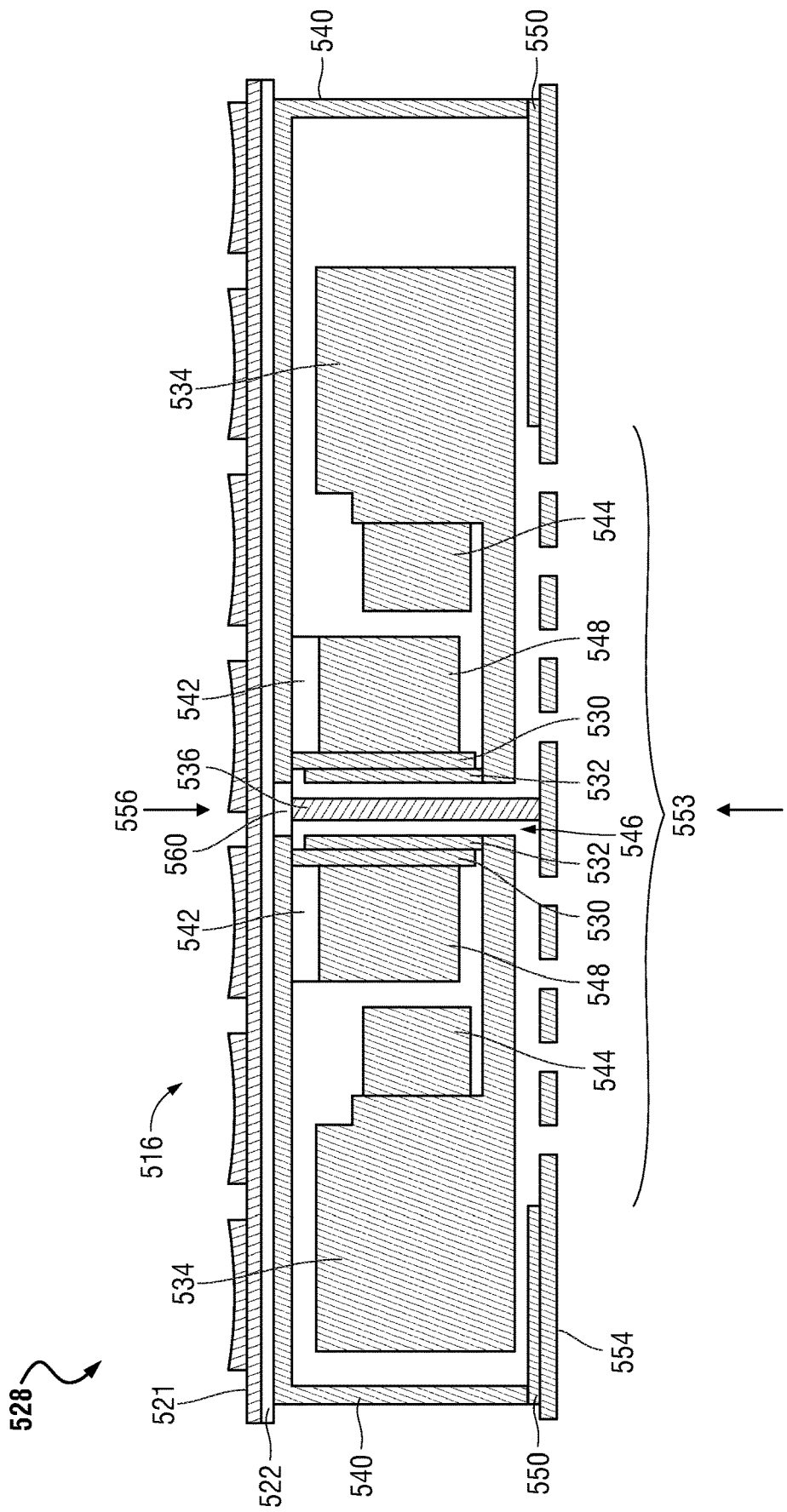
FIG. 5 is a graphical illustration of a side, cut-out view of a blower fan system according to another embodiment of the present disclosure.

FIG. 5 is a graphical illustration of a side, cut-out view of a fan according to another embodiment of the present disclosure. The blower fan system 528 shown in FIG. 5 may be used to cool any device described herein. The blower fan system 528 may be placed within any information handling system or any other system that may be cooled by the operation of the blower fan system 528 and in any orientation to draw air through an inlet vent 553 and dispense air throughout an information handling system chassis. The present specification describes a specific embodiment where the blower fan system 528 is placed within a notebook-type information handling system. In this embodiment, the blower fan system 528 may include a top fan chassis 540 and a bottom fan chassis 550 to house the blower fan system 528 within a chassis of the notebook-type information handling system. Each of the top fan chassis 540 and bottom fan chassis 550 may be mechanically coupled to another chassis within the information handling system in an embodiment. In an alternative embodiment, the top fan chassis 540 and bottom fan chassis 550 may be eliminated with a keyboard support chassis serving as the top fan chassis 540 or the D-cover serving as the bottom fan chassis 550. As described, the bottom fan chassis 550 and top fan chassis 540 are prevented, by the fan support rod 536, from bending into the cavity formed between the fan blades 534 and the and housing of the blower fan system 528. FIG. 5 shows a depiction of a specific arrangement of elements of the blower fan system 528. However, the present specification contemplates other physical arrangements of the elements of the blower fan system 528 as well as the addition of other elements without materially departing from the novel teachings and advantages of the embodiments of the present disclosure.

As described herein, the information handling system may include a number of chassis including an A-cover (not shown), a B-cover (not shown), a C-cover (e.g., 521), a D-cover 554, and a keyboard support chassis 522. The A-cover and the B-cover may be joined together in an embodiment to form a fully enclosed display chassis (not shown) of the notebook-type information handling system. The C-cover 521 and the D-cover 554 may be joined together to form a fully enclosed base chassis. These chassis described herein may be coupled together via a hinge operably connecting the display chassis (e.g., the A-cover and B-cover assembly) with the base chassis (e.g., C-cover 521 and the D-cover 554 assembly) so as to place the base chassis of the notebook-type information handling system in a plurality of configurations with respect to a digital display enclosed within the display chassis as with a convertible laptop information handling system. The C-cover 521 may house a keyboard 516 used by a user of the information handling system to provide input. The keyboard 516 may include any number of keys that form, for example, a QWERTY-type keyboard. Any number of keys may be used to form the keyboard 516 and the present specification contemplates that any other type of input device may be incorporated into the C-cover 521 such as a trackpad.

In this embodiment, the blower fan system 528 may include a cylindrical bearing 530 having a cylindrical hollow receiving portion. The cylindrical bearing 530 may include the cylindrical hollow receiving portion extending from a top of the cylindrical bearing 530 to the bottom of the cylindrical bearing 530. The cylindrical hollow receiving portion of the cylindrical bearing 530 may form a through-hole 546 through which a fan support rod 536 may be passed and within which the cylindrical main shaft 532 may be rotatably coupled. In an embodiment, the cylindrical bearing 530 is in the form of a hollow tube that is mechanically coupled to the C-cover 521 or other chassis as described herein such as a dedicated top fan chassis 540. The cylindrical bearing 530 may be of any shape outside of the cylindrical hollow portion to support the PCB 542 and electromagnet 548 or be fit or coupled to the top fan chassis 540 or the keyboard chassis 522.

The blower fan system 528 also includes a printed circuit board (PCB) 542. The PCB 542 may include circuitry that electrically couples a processor of the information handling system executing code of a fan module with an electromagnet 548 or a series of electromagnets 548. The permanent magnet 544 and electromagnet 548 form a magnetic drive system to drive the fan blades 534. By coupling the processor with the electromagnet 548, the PCB 542 may control the activation of the electromagnet 548 during operation of the blower fan system 528. The activation of the electromagnet 548 during operation of the blower fan system 528 may cause the set of fan blades 534 and a cylindrical main shaft 532 rotatably coupled inside the cylindrical hollow receiving portion to rotate about the PCB 542 and electromagnet 548 thereby creating an airflow through the blower fan system 528.

The blower fan system 528 also includes the cylindrical main shaft 532 as described herein. The cylindrical main shaft 532 also includes a shaft pass-through hollow portion extending from a top of the cylindrical main shaft 532 to the bottom of the cylindrical main shaft 532. Similar to the cylindrical bearing 530, the cylindrical main shaft 532 may form a through-hole 546 through which a fan support rod 536 is passed. In an embodiment, the cylindrical bearing 530 is in the form of a hollow tube that is mechanically and rotatably coupled to the cylindrical bearing 530 via a ball bearing or roller bearing or other support that allows the cylindrical main shaft 532 to rotate freely within the cylindrical bearing 530 while being mechanically held within the interior surface of the cylindrical hollow receiving portion of the cylindrical bearing 530. The hollow tube of the cylindrical main shaft 532 may be of any interior shape, but the exterior of the cylindrical main shaft 532 may be cylindrical to rotate within the cylindrical bearing 530.

In an embodiment, the bottom fan chassis 550 may be a part of the D-cover 554, with the D-cover 554 and C-cover 521 housing the blower fan system 528 within the information handling system. In this embodiment, a portion of the D-cover 554 below the blower fan system 528 may have a number of holes or slats formed therein to create a D-cover inlet vent 553 that allows the air to pass through the D-cover inlet vent 553, into the blower fan system 528, and out of a blower outlet aperture or apertures and throughout the information handling system. Because the D-cover 554 at the D-cover inlet vent 553 may be structurally weak, the D-cover 554 may be relatively more deformable at the D-cover vent 553 in some embodiments. Because of this, when an upward force 558 is applied to the D-cover inlet vent 553 either purposefully or accidentally, the D-cover 554 may be prevented from damaging the blower fan system 528 as a result of the arrangement of the fan support rod 536 within the through-hole 546. In some embodiments, the fan support rod 536 may prevent any deformation of the D-cover 554 into the blower fan system 528 based on the rigidity of the fan support rod 536. The fan support rod 536 may be made of metal, plastic, carbon fiber, or other material that can be formed into a rod or tube used to support the blower fan system 528. Similarly, as the user presses against any of the keys of the keyboard 552, the keyboard 552 and/or keyboard support chassis 522 may be deformed into the blower fan system 528 in a downward direction 556. This deformation, however, is also prevented through the placement of the fan support rod 536 within the through-hole 546.

In addition to the fan support rod 536, the blower fan system 528 may include, in an embodiment, a fan support rod alignment feature 560. In this embodiment, the fan support rod alignment feature 560 may be used to accurately align the fan support rod 536 through the through-hole 546. In such an embodiment, the C-cover 521, keyboard support chassis 522, or other chassis as described herein may be coupled to the keyboard 516 such that the fan support rod alignment feature 560 is placed center of the cylindrical bearing 530 and cylindrical main shaft 532. By doing so, the fan support rod 536, when mechanically coupled to the fan support rod alignment feature 560, is assured to pass through a center of the through-hole 546 such that is does on come in contact with the interior surfaces of either the cylindrical bearing 530 or cylindrical main shaft 532 during operation of the blower fan system 528. In an embodiment, the fan support rod alignment feature 560 may also or alternatively be coupled to the D-cover 554 so as to similarly align the fan support rod 536 as described.

Figure 6:
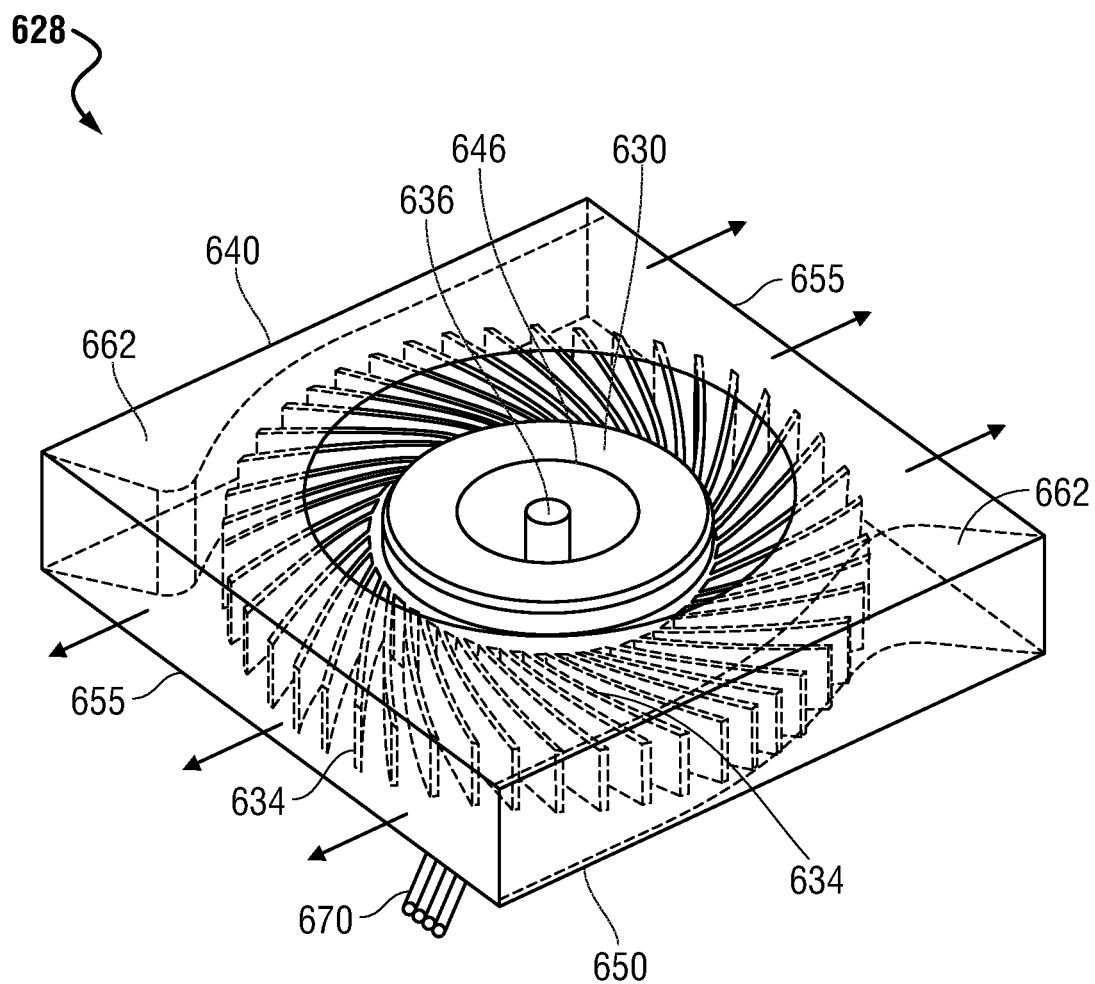
FIG. 6 is a perspective view of a blower fan system according to another embodiment of the present disclosure.

FIG. 6 is a perspective view of a blower fan system according to another embodiment of the present disclosure. The blower fan system 628 shown in FIG. 6 includes, at least, a top fan chassis 640 and in some embodiments, may further include a bottom fan chassis 650 similar to those embodiments described in connection with, for example, FIGS. 2-5.

The blower fan system 628 may, in this embodiment, include a side wall 662 depicted as such as ghosted elements within the top fan chassis 640 of the blower fan system 628. The blower fan system 628 may include at least one blower fan outlet aperture 655. The top fan chassis 640 may be formed into a dual opposite outlet blower system that includes plural blower fan outlet apertures 655 at one or more sides of the blower fan system 628 in the plane of rotation of a set of fan blades 634. Blower fan system 628 may include a through hole 646 formed through a cylindrical main shaft 630 similar to other cylindrical main shafts described herein. In this embodiment, the cylindrical bearing (not shown) has been removed to show more details of the blower fan system 628.

In the example embodiment shown in FIG. 6, the fan blades 634 extend from the cylindrical main shaft 630 and are angled away from the direction of rotation of blower fan system 628. Any effective fan blade shape, size, angle or pitch is contemplated herein and may be used to move air within the blower fan system 628 and out of the dual blower fan outlet apertures 655 of the embodiments within the present disclosure.

The blower fan system 628 may also include a support rod 636. The fan support rod 636 may be placed within the through hole 646 formed through a cylindrical main shaft 630 and through the cylindrical bearing (not shown) so that the deflection of any of a keyboard chassis (not shown), a C-cover (not shown), or a D-cover (not shown) into the blower fan system 628 and its fan blades 634 may be prevented. In an embodiment, the fan support rod 636 may be a rigid material such as metal, plastic, carbon fiber, or other similar materials and may be tubular in some embodiments.

The dual blower fan outlet apertures 655 may be fluidically coupled to an air inlet vent either formed above the fan blades 634 and through a C-cover or below the fan blades 634 and through a D-cover. A blower fan inlet aperture may be oriented on either side of the blower fan system 628 to draw air into the blower fan system, and the blower fan system 628 of the present embodiment may be installed in an information handling system in any orientation. The air inlet vent may draw air into the blower fan system 628, pass the air throughout the top fan chassis 640, and pass the air out of one or both of the blower fan outlet apertures 655 in an embodiment. In the embodiments described herein, the air inlet vent of the blower fan system 628 may be of any shape and may be situated on any face of the blower fan system 628 or even include an air inlet vent to be on a side wall.

The blower fan system 628, as shown, has two blower fan outlet apertures 655. One or more outlet apertures 655 are contemplated and maybe of any shape. The two blower fan outlet aperture 655 may be opposite one another in one example embodiments such that the flow of air out of the blower fan system 628 may happen in generally opposite directions. In one example embodiment, the blower fan system 628 may have outlet air movement at anywhere from 120 degrees to 240 degrees in opposite directions.

In an embodiment, the blower fan system 628 may include two side walls 662 each extending internally from the top fan chassis 640. The side walls 662 may be a curvilinear shape inside the top fan chassis 640 and internal to the blower fan system 628. The side walls 662 may curve away from blower fan outlet aperture 655 alongside the walls of the top fan chassis 640 such that they form a notch angle. The curvilinear shape may increase along a respective internal wall of the top fan chassis 640 in the direction of rotation (clockwise as depicted) of the fan blades 634 and then recede to follow the shape of the circumference of the fan blades 634. The side walls 662 are at least partially in the plane of rotation of the fan blades 634. The side walls 662 may extend from the internal surfaces of the top fan chassis 640 to varying degrees in some embodiments to determine the level of generated air pressure desired or to determine allowable levels of noise during operation. Design of the extension of the side walls 662 around the fan blades 634 blade diameter may involve various considerations among tradeoffs between air flow, air pressurization, and operational noise such that side walls 662 may vary in size or shape in multiple variations on the embodiments herein.

As described herein, the air expelled out of the blower fan outlet aperture 655 is circulated into the base chassis of the information handling system. In the embodiments descried herein, the blower fan outlet apertures 655 may direct the air across or near other thermal regulating components such as heat sinks, heat pipes, exhaust vents, and vapor chambers, among others. In some embodiments, the air is then expelled out of the base chassis via an exhaust vent (not shown).

In an embodiment, the blower fan system 628 may include power and/or signal leads 670 that electrically and communicatively couple the blower fan system 628 to a power source (not shown) and a processor (not shown) of the information handling system. As described herein, the processor may send signals to a PCB (not shown) to direct that, for example, a magnetic drive system to drive the fan blades 634.

Figure 7:
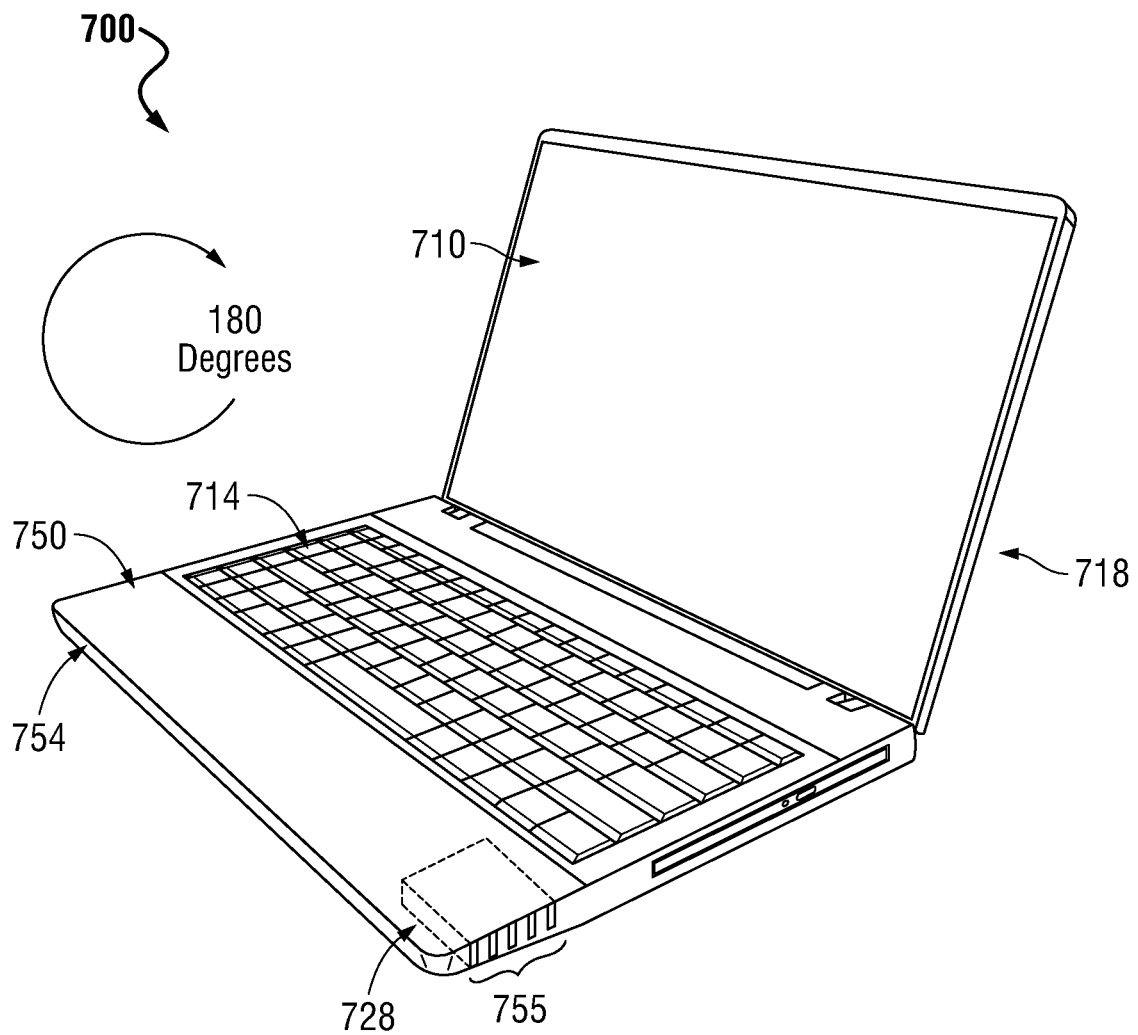
FIG. 7 is a perspective view of an information handling system according to another embodiment of the present disclosure.

FIG. 7 is a perspective view of an information handling system 700 according to another embodiment of the present disclosure. The information handling system 700 is shown in an open configuration for illustration purposes. It is understood that a closed configuration would have the display chassis fully closed onto the base chassis. In some embodiments, the display chassis and base chassis may be made of metal. The display chassis may be formed of A-cover 718 and B-cover 710, and base chassis may be formed of C-cover 750 and D-cover 754. The A-cover 718 and B-cover 710 function to enclose a portion of the information handling system including a display screen. The D-cover 754 functions to enclose another portion of the information handling system along with a C-cover 750 serving as a base chassis which may include a blower fan system 728. The C-cover 750 may include, for example, a keyboard 714, a trackpad, or other input/output (I/O) device. When placed in the closed configuration, the A-cover 718 forms a top outer protective shell, or a portion of a lid for the information handling system, while the D-cover 754 forms a bottom outer protective shell, or a portion of a base chassis. When in the fully closed configuration, the A-cover 718 and the D-cover 754 would be substantially parallel to one another.

As described herein, the base chassis may house the blower fan system 728 as described herein. Although, FIG. 7 shows the placement of the blower fan system 728 at a specific location, the present specification contemplates that the blower fan system 728 may be placed anywhere in the information handling system. The information handling system 700 may also include an inlet vent (not shown) used to pull air into the blower fan system 728 when the blower fan system 728 is activated and an outlet vent 755 to exhaust air from the information handling system. In the example shown in FIG. 7, the outlet exhaust vent 755 is formed on a side wall of the D-cover 754. However, as shown in FIGS. 2-6, an inlet vent may be formed through a bottom surface of the D-cover 754 or, alternatively in a surface of the C-cover 750 and similarly an outlet vent may be placed anywhere in the C-cover 750 or D-cover 754 to exhaust air.

Figure 8:
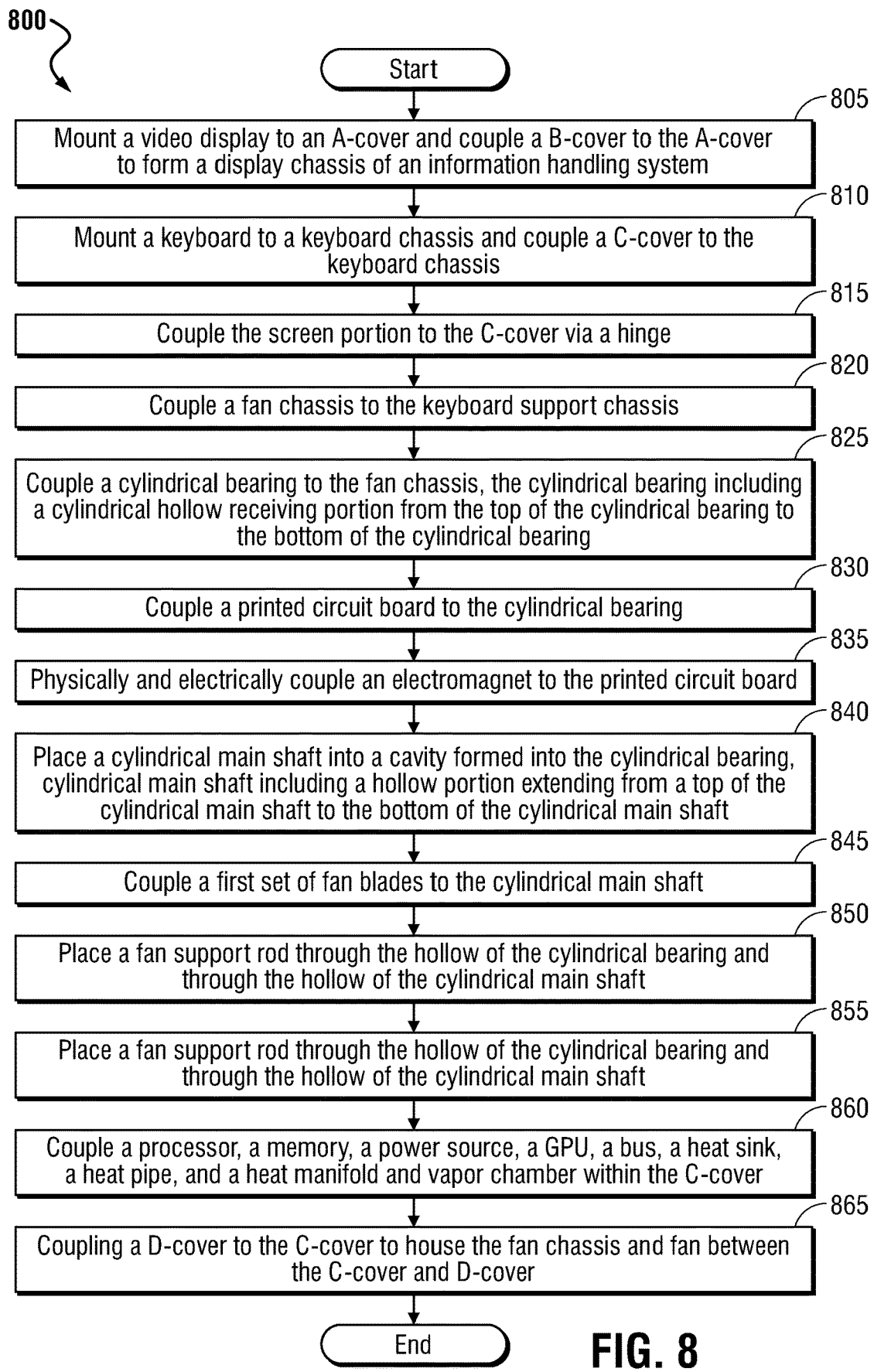
FIG. 8 is a flow diagram illustrating a method of manufacturing an information handling system according to an embodiment of the present disclosure.

FIG. 8 is a flow diagram illustrating a method 800 of manufacturing an information handling system according to an embodiment of the present disclosure. The method 800 may include, at block 805, mounting a video display to an A-cover and coupling a B-cover to the A-cover to form a display chassis of the information handling system. The method 800 may also include, at block 810, with mounting a keyboard to a keyboard support chassis and coupling a C-cover to the keyboard support chassis to form a base portion of the information handling system. The display chassis and the base chassis may then by coupled together via a hinge a block 815. This may form a semi-complete information handling system without the D-cover assembled thereto.

The method 800 may also include coupling a fan chassis to the keyboard support chassis at block 820. As described herein, the coupling of a fan chassis may not be completed and the central bearing of the blower fan system may be directly coupled to the keyboard support chassis in an alternative embodiment. In this embodiment, the method 800 may continue with coupling the cylindrical bearing to the fan chassis at block 825. The cylindrical bearing may be any external shape to facilitate mechanical attachment to the keyboard support chassis or fan chassis, such as a press fit or other attachment to these chassis. A printed circuit board (PCB) may be coupled to the cylindrical bearing at block 830. The PCB may be communicatively coupled to a processor of the information handling system. The method 800 includes physically and electrically coupling an electromagnet to the PCB at block 835. The electric coupling of the electromagnet to the PCB allows for signals from the processor to be sent to the PCB to direct the activation and deactivation of the electromagnet.

The method 800 further includes, at block 840, with placing a cylindrical main shaft into a cylindrical cavity formed into the cylindrical bearing, cylindrical main shaft including a shaft pass-through hollow portion extending from a top of the cylindrical main shaft to the bottom of the cylindrical main shaft forming a pass-through hole. In an embodiment, a set of bearings may physically and rotationally couple the cylindrical main shaft to the cylindrical bearing. The present specification contemplates other coupling means used to maintain the cylindrical main shaft into the cylindrical bearing.

The method 800 also includes coupling a first set of fan blades to the cylindrical main shaft at block 845. The fan blades may be coupled to the cylindrical main shaft via, for example, a fasteners, or the fan blades and cylindrical main shaft may be formed of a monolithic piece of material such as aluminum or another metal, plastic, or other suitable materials. Other implementations may include soldering or welding the set of fan blades to the cylindrical main shaft depending on the respective materials the blades and cylindrical main shaft are made of.

The method 800 may include, at block 850, placing the fan support rod through the hollow of the cylindrical bearing and through the cylindrical main shaft. In an embodiment, the fan support rod may be mechanically coupled to an underside of a keyboard or keyboard support chassis. In an alternative embodiment, the fan support rod may be coupled to a top fan chassis. In another embodiment, the fan support rod may be mechanically coupled to a top surface of a D-cover and may be inserted into the pass through hole in the cylindrical main shaft when the D-cover is coupled to the C-cover at block 865 to house the fan chassis and blower fan system. In some embodiments, the fan support rod may be mechanically coupled to an underside of the keyboard or keyboard support chassis and to the top surface of the D-cover.

The method 800 may further include adding a processor, a memory, a power source, a GPU, a bus, a heat sink, a heat pipe, and a heat manifold and vapor chamber within the C-cover or D-cover at block 860. As described herein, the processor, memory may be operatively coupled via a bus. The processor may also be operatively coupled to the PCB, fan module, the power management unit, and power source. In an embodiment, each of these may be operatively coupled to each other via the bus.

The blower fan system may be thermally coupled to the processor in order to draw an amount of heat from the processor. Other heat sinks may also be included within the base chassis of the information handling system such that the airflow produced by the blower fan system carries away the heat from the heat sinks. The other cooling systems such as the heat pipe and the heat manifold and vapor chamber may also be included within the base chassis and coupled to the C-cover in order to interact with the airflow produced by the v blower fan system throughout the information handling system.

The method 800 further includes, at block 865, coupling a D-cover to the C-cover to house the fan chassis and fan between the C-cover and D-cover. This coupling may include coupling the D-cover to the C-cover via one or more fasteners, welding the D-cover to the C-cover, gluing the D-cover to the C-cover, among other fastening processes. At this point, the information handling system may be finally assembled, powered up, and used. The method may end here.

The blocks of the flow diagrams of FIG. 8 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system comprising:
a processor, a memory, and a power source; and
a blower fan system including:
a cylindrical bearing including a cylindrical hollow receiving portion extending from a top of the cylindrical bearing to a bottom of the cylindrical bearing;
a cylindrical main shaft rotatably coupled in the cylindrical hollow receiving portion of the cylindrical bearing including a shaft pass-through hollow portion extending from a top of the cylindrical main shaft to a bottom of the cylindrical main shaft to form a pass-through hole;
a set of fan blades mechanically coupled to the cylindrical main shaft, the set of fan blades having a set of magnets;
an electromagnet arranged to rotationally drive the set of fan blades;
a fan support rod passing through the cylindrical bearing and the cylindrical main shaft at the shaft pass-through hollow portion and mechanically supporting the blower fan system within a base chassis of the information handling system to prevent a deflection of the bases chassis into a rotation of the set of fan blades;
a D-cover vent formed in a D-cover below the blower fan system; and an exhaust vent in the base chassis of the information handling system.

2. The information handling system of claim 1, further comprising a printed circuit board and the electromagnet mechanically coupled to the cylindrical bearing, wherein the printed circuit board comprises an electrical circuitry to receive electrical signals from a fan module to control an actuation of the electromagnet and cause the rotation of the set of fan blades.

3. The information handling system of claim 1, wherein the set of magnets including a set of permanent magnets mechanically coupled to the set of fan blades to magnetically couple the set of fan blades to the electromagnet mechanically coupled to the cylindrical bearing to cause the rotation of the set of fan blades.

4. The information handling system of claim 1, wherein the fan support rod is a tube supporting the fan from the deflection of the base chassis of the information handling system.

5. The information handling system of claim 1, further comprising a keyboard support chassis formed above the blower fan system, and wherein the fan support rod is mechanically coupled to an underside of the keyboard support chassis.

6. The information handling system of claim 1, further comprising the D-cover formed below the blower fan system and wherein the fan support rod is mechanically coupled to the D-cover.

7. A blower fan for use in an information handling system thermal regulation system comprising:
a fan housing to house the blower fan having an outlet aperture on one side rotationally co-planar with a set of fan blades; the blower fan including:
a power input; a cylindrical bearing including a cylindrical hollow receiving portion extending from a top of the cylindrical bearing to a bottom of the cylindrical bearing;
a cylindrical main shaft rotatably inserted into the cylindrical hollow receiving portion of the cylindrical bearing;
the cylindrical main shaft including a shaft pass-through hollow portion extending from a top of the cylindrical main shaft to a bottom of the cylindrical main shaft, the set of fan blades mechanically coupled to the cylindrical main shaft; and
a fan support rod passing through the cylindrical bearing and the cylindrical main shaft at the shaft pass-through to support the blower fan within the fan housing to prevent a deflection of a chassis of the information handling system into a rotation of the fan blades;
a magnetic drive system to rotationally drive the set of fan blades; and
a D-cover formed below the blower fan and wherein the fan support rod is mechanically coupled to the D-cover wherein the fan housing is mechanically coupled to a keyboard support chassis formed above the blower fan.

8. The blower fan of claim 7, further comprising a printed circuit board and an electromagnet mechanically coupled to the cylindrical bearing, wherein the printed circuit board comprises electrical circuitry to receive electrical signals from a processor and power to drive an actuation of the electromagnet forming a part of the magnet drive system.

9. The blower fan of claim 7, further comprising a permanent magnet mechanically coupled to the set of fan blades to magnetically couple the set of fan blades to an electromagnet mechanically coupled to the cylindrical bearing of the magnetic drive system.

10. An information handling system comprising:
a keyboard support chassis to mount a keyboard thereon including a C-cover to house the keyboard; and
a processor, memory, and power source;
a blower fan including: a cylindrical bearing including a cylindrical hollow receiving portion extending from a top of the cylindrical bearing to a bottom of the cylindrical bearing;
a cylindrical main shaft rotatably coupled in the cylindrical hollow receiving portion of the cylindrical bearing;
the cylindrical main shaft including a hollow portion extending from a top of the cylindrical main shaft to a bottom of the cylindrical main shaft;
a set of fan blades mechanically coupled to the cylindrical main shaft;
an electromagnetic motor to rotationally drive the set of fan blades;
a fan support rod passing through the cylindrical bearing and the cylindrical main shaft, the fan support rod mechanically supporting the blower fan between the keyboard support chassis and a D-cover to prevent a deflection of the D-cover into a rotation of the set of fan blades; and
a blower fan housing including an inlet vent and a blower outlet aperture to dispense cooling air between the C-cover and the D-cover.

11. The information handling system of claim 10, further comprising a printed circuit board and an electromagnet mechanically coupled to the cylindrical bearing, wherein the printed circuit board comprises an electrical circuitry to receive electrical signals from the processor to drive the actuation of the electromagnet as a part of the electromagnetic motor.

12. The information handling system of claim 10, further comprising a permanent magnet mechanically coupled to the set of fan blades to magnetically couple the set of fan blades to an electromagnet mechanically coupled to the cylindrical bearing operating as the electromagnetic motor of a magnetic drive system.

13. The information handling system of claim 10, further comprising a fan support rod alignment plug in a center of the cylindrical bearing in the cylindrical hollow receiving portion to align the fan support rod the cylindrical main shaft wherein the fan support rod alignment plug is mechanically coupled to the fan support rod.

14. The information handling system of claim 10, wherein the fan support rod is mechanically coupled to the keyboard support chassis.

15. The information handling system of claim 10, wherein the fan support rod is mechanically coupled to the D-cover.

16. The information handling system of claim 1, further comprising:
the cylindrical bearing being operatively coupled to a bottom surface of a top fan chassis of the blower fan system.

17. The information handling system of claim 1, further comprising: the cylindrical bearing that is being operatively coupled to a bottom surface of a keyboard chassis of the information handling system.

18. The blower fan of claim 7, wherein the fan support rod passes through the cylindrical main shaft without contacting an interior surface of the cylindrical main shaft.

19. The information handling system of claim 10, further comprising:
the cylindrical bearing being operatively coupled to a bottom surface of a top fan chassis of the blower fan.

20. The information handling system of claim 10, wherein the fan support rod passes through the cylindrical main shaft without contacting an interior surface of the cylindrical main shaft.

* * * * *